United States Patent
Hsu et al.

[11] Patent Number: 5,573,964
[45] Date of Patent: Nov. 12, 1996

[54] METHOD OF MAKING THIN FILM TRANSISTOR WITH A SELF-ALIGNED BOTTOM GATE USING DIFFUSION FROM A DOPANT SOURCE LAYER

[75] Inventors: Louis L. Hsu, Fishkill; Mary J. Saccamango, Poughquag; Joseph F. Shepard, Hopewell Junction, all of N.Y.

[73] Assignee: International Business Machines Corporation, Armonk, N.Y.

[21] Appl. No.: 559,809

[22] Filed: Nov. 17, 1995

[51] Int. Cl.[6] ................................................ H01L 21/84
[52] U.S. Cl. ........................... 437/40; 437/162; 437/164
[58] Field of Search ............................. 437/40, 41, 162, 437/21, 44, 164; 257/347

[56] References Cited

U.S. PATENT DOCUMENTS

| | | |
|---|---|---|
| 4,488,348 | 12/1984 | Jolly et al. ........................... 29/571 |
| 4,603,468 | 8/1986 | Lam ..................................... 29/571 |
| 4,628,589 | 12/1986 | Sundaresan ........................ 29/571 |
| 4,987,092 | 1/1991 | Kobayashi et al. ................. 437/57 |
| 5,024,959 | 6/1991 | Pfiester ................................. 437/34 |
| 5,158,898 | 10/1992 | Hayden et al. ..................... 437/21 |

*Primary Examiner*—John Niebling
*Assistant Examiner*—Richard A. Booth
*Attorney, Agent, or Firm*—Kris V. Srikrishnan

[57] ABSTRACT

A simple method of making a thin film transistor (TFT) on a substrate with an insulating surface layer is disclosed. A layer of dopant source layer is deposited on the insulating layer, followed by defining a gate stack consisting of a gate polysilicon, gate insulator and a protective polysilicon using the dopant source layer as an etch stop. Sidewall spacers are formed in contact with the gate stack. A TFT body polysilicon is deposited and patterned, forming thereby the source and drain regions in a self-aligned manner. By heating, the dopants from the dopant source layer are driven into the source/drain and to part of the off-set regions of the body polysilicon layer while simultaneously also doping the gate polysilicon.

17 Claims, 3 Drawing Sheets

METHOD OF MAKING THIN FILM TRANSISTOR WITH A SELF-ALIGNED BOTTOM GATE USING DIFFUSION FROM A DOPANT SOURCE LAYER

FIELD OF THE INVENTION

The present invention relates generally to a semiconductor process for fabricating a thin film transistor device (TFT) and in particular relates to an improved process for defining a bottom gate thin film transistor.

BACKGROUND OF THE INVENTION

Thin film transistors are field effect transistors (FETs) that offer major cost and density advantages. However, TFTs have some inferior characteristics such as lower gains and higher off-state leakage currents. Unlike the conventional FETs where the source, drain and channel regions are formed in the body of a single crystal substrate, the device regions of a TFT are formed in a polysilicon or an amorphous silicon layer (device layer) overlying a substrate. Since the polysilicon layer is formed at relatively lower temperatures and need not be in the body of the single crystal substrate, the device regions can be formed above the substrate to form stacked transistors, an advantage which provides greater density and lower cost. The TFTs are most commonly used in flat panel displays as switching transistors and in Static Random Access Memories (SRAM) as load devices. Because the device polysilicon layer (channel layer) is not part of the substrate 5, the gate insulator 7 and electrode 6 can be positioned over the channel layer 8 (Top-Gate TFT) as shown in FIG. 1A, or under the channel layer 8 (Bottom-Gate TFT) as shown in FIG. 1B. Whereas both top-gated and bottom-gated TFTs have been used in SRAMs, bottom-gated TFTs are more popular as they lead to greater packing density. The conventional bottom-gated TFT suffers disadvantages from (i) requiring an extra mask since source and drain regions are defined by lithography masking techniques and, (ii) drain off-sets that are lithographically defined and hence not self-aligned and symmetrical. This causes inconsistent "on" and "off" currents. Drain off-sets are a desired feature in TFTs and are simply lightly doped regions placed outside the edge of the gate conductor, somewhat similar to lightly doped drains (LDDs) in FETs. Drain off-sets reduce punch-thru problems and reduce the off-state leakage current.

Hayden et al., teach in U.S. Pat. No. 5,158,898, a method to form self-aligned bottom-gated TFT, which is shown in FIG. 2. Referring to FIG. 2, Hayden et al. form a stacked structure consisting of a gate electrode 16 and a gate insulator 26 and a sacrificial layer (not shown). By depositing and planarizing, insulator regions 22 are formed between the stacked structures. The sacrificial layer is removed to provide recessed gate regions 13 and 15. A polysilicon layer 28 (device layer) is deposited in the recess in a conformal manner and a dielectric layer 30 is deposited over layer 28. The remaining recess region is covered with a plug 32 which can be insulating such as spin-on glass or conducting such as polysilicon. An implantation is used to selectively dope the device layer not covered by the plug 32 to create the source/drain regions. The vertical segments of the polysilicon layer 37 are considered off-set regions, the region below the plug 28 is the channel region and is controlled by gate oxide 26. This process provides a self-aligned bottom-gated TFT, but involves many process steps that are difficult to control. In an alternate embodiment (not shown), the insulator 22 act as dopant source to the source and drain regions but prevented from doping the off-set regions by use of a diffusion barrier lining not shown. This process is equally complicated as the formation of device structure and dopant source involve controlled planarization and many process steps. This approach is not preferred for applications where low cost and low complexity are desired.

Another major interest in TFTs is to build vertically stacked GATE MOS device. U.S. Pat. No. 4,488,348 issued to Richard Jolly, teaches a method that is very cumbersome and involves polycrystalline silicon deposition, laser recrystallization, ion implantation and out-diffusion from a dopant layer. The resultant structure is quite complex.

U.S. Pat. No. 4,603,468 issued to H. W. Lam teaches formation of a single gate device to address underlying n-channel and overlying p-channel. The process involves conformally depositing a layer of doped oxide over the gate region, followed by etching back (with a planarizing layer) to remove the doped glass layer from above the gate region. A polycrystalline layer is deposited over this structure and by diffusion annealing the p-channel device is doped where it is in contact with the doped glass and not over the gate region. This process is somewhat similar to the Hayden et al.'s alternate embodiment process and suffers from difficulty to control etch-back planarization of very thin layers and steps (the gate height). Further, there is no provision for the formation of an off-set region in this process.

U.S. Pat. No. 4,628,589 issued to R. Sundaresan is somewhat similar to the Lam's process, except in this approach, the p-channel layer is first deposited conformally over the gate, followed by a deposition of doped glass layer, etch back to remove the doped glass from over the gate region and followed by annealing at a high temperature. Thus, only the source and drain regions in the polycrystalline layer are doped from the dopant containing layer from the top. No provision is made in this process for forming the off-set regions. The Sundaresan process also suffers from processes difficult to control, similar to the Lam process.

Thus, there is a clear need in TFT manufacturing for a simplified and high yielding process, that is self-aligning, allows for the formation of off-set regions and involves fewer, easily controllable manufacturing steps.

OBJECTS OF THE INVENTION

An object of the present invention is to provide a manufacturing process for a TFT with improved yield and reliability.

Another object of the present invention is to provide a self-aligned process for forming the source and drain regions in a TFT and further allows for the formation of self-aligned off-set regions.

A further object of the present invention is to provide a low cost manufacturing process, usable on large substrates and can provide small cell size.

A still further object of the present invention is to provide for simultaneous impurity doping of the gate, source and drain regions of a TFT.

SUMMARY OF THE INVENTION

A simple method of making a thin film transistor (TFT) on a substrate with an insulating surface layer is disclosed. A layer of dopant source layer is deposited on the insulating layer, followed by defining a gate stack consisting of a gate polysilicon, gate insulator and a protective polysilicon using the dopant source layer as an etch stop. Sidewall spacers are formed in contact with the gate stack. A TFT body polysilicon is deposited and patterned, forming thereby the source and drain regions in a self-aligned manner. By heating, the dopants from the dopant source layer are driven into the source/drain and to part of the off-set regions of the body polysilicon layer while simultaneously also doping the gate polysilicon.

BRIEF DESCRIPTION OF THE DRAWINGS

The objects, features and advantages of the present invention will be apparent from the following more particular description of the invention illustrated in the accompanying drawings, in which.

DETAILED DESCRIPTION OF THE INVENTION

The present invention overcomes many of the process difficulties associated with the prior art processes, by the use of sidewall spacers formed in a self aligned manner without use of masks along the sidewalls of a gate electrode. A gate stack consisting of a bottom polysilicon layer (gate polysilicon), a gate insulator, and a thin layer of polysilicon over the gate insulator (for protecting the gate insulator during the etching process), is patterned. An insulating layer is deposited in a blanket manner over the gate stack, and etched in an anisotropic manner to form the sidewall spacers. A blanket polysilicon layer is then deposited over the gate stack and patterned to form the TFT body polysilicon. The gate stack and the spacer were used as a mask to selectively dope the gate electrode, and the source, drain regions of the body polysilicon by diffusion. These and other features of the invention are better described by use of a process shown in the cross-sectional pictures of FIGS. 3A–3D and FIG. 4.

Figure 1A:
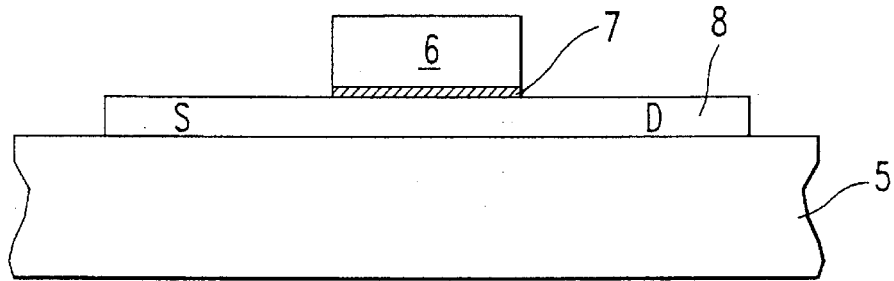
FIGS. 1A and 1B are illustrations of a top-gated and bottom-gated TFTs respectively.
Figure 1B:
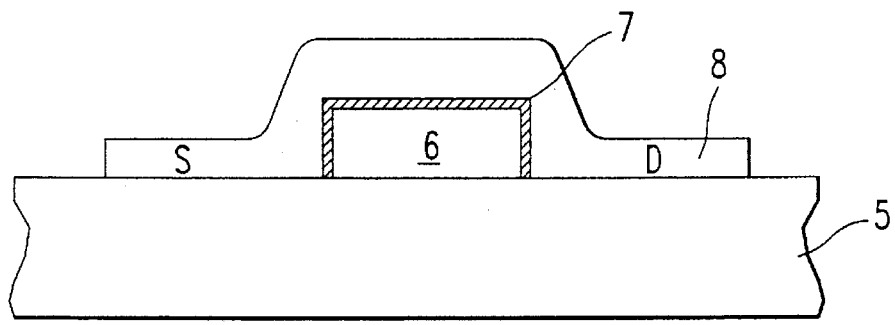
Figure 2:
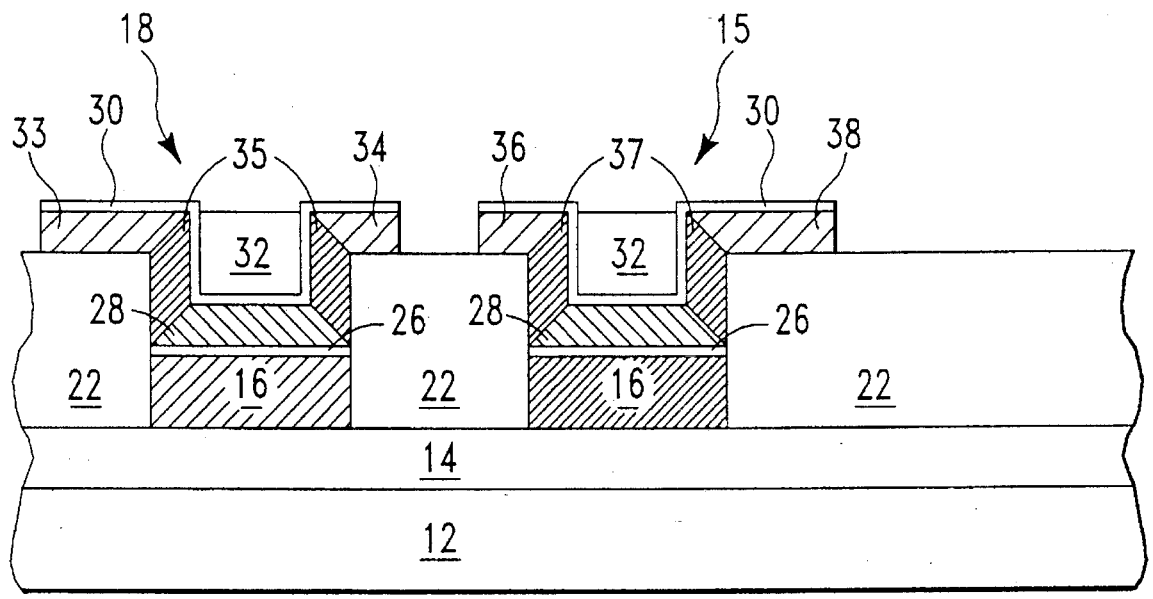
FIG. 2 is a prior art bottom gated TFT.
Figure 3A:
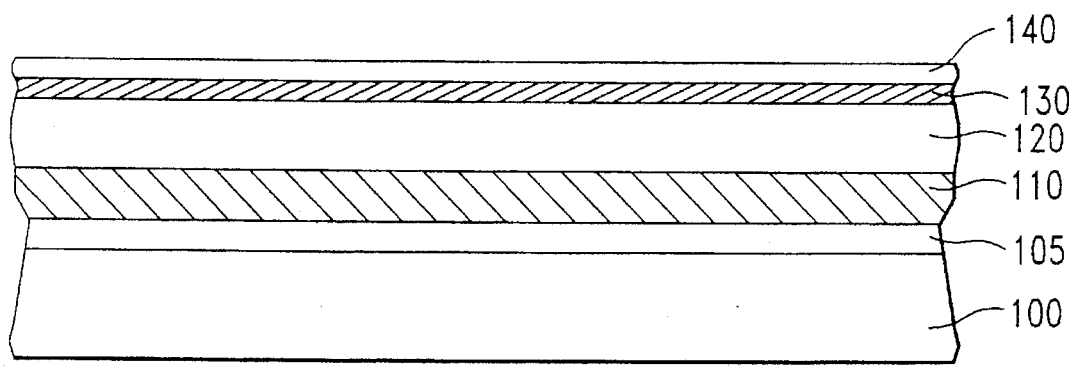
FIGS. 3A–3D are series of cross sections illustrating a generalized concept of the present invention.
Figure 3B:
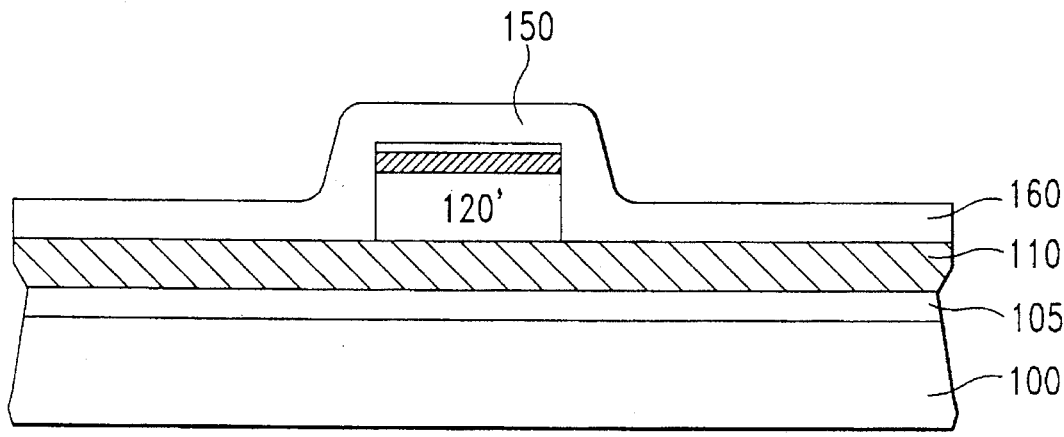
Figure 3C:
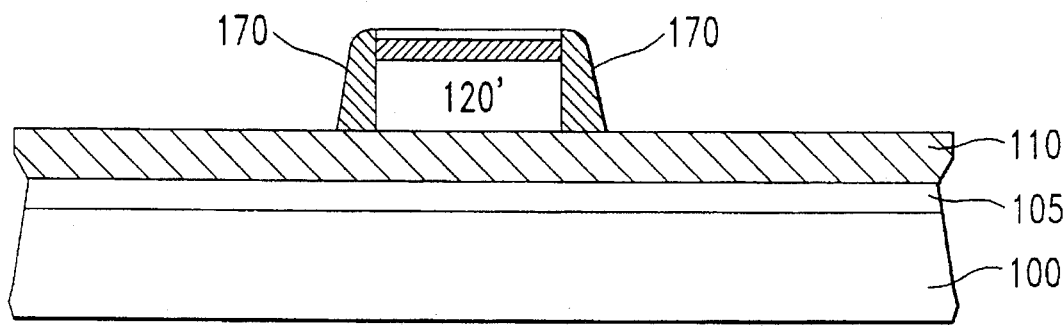

Now referring to FIG. 3A, an insulating layer 105 is formed on a substrate 100. Substrate 100 can contain devices formed therein such as FETs, Capacitors, Resistors etc. and is usually a silicon wafer in semiconductor applications, and a glass substrate in TFT applications. Layer 105 is usually silicon dioxide or silicon nitride, preferably formed by deposition but can also be the result of prior processing steps such as contact stud formation and may contain conductive wiring and stud features. A dopant glass layer 110 is formed over layer 105. Layer 110 is usually an oxide layer with high dopant concentration such as borosilicate glass or phosphosilicate glass and can be deposited by conventional techniques such as PECVD, CVD, sputtering, evaporation, etc.. Layer 110 as deposited is usually $B_2O_3 \cdot SiO_2$. In the deposition process, a source of boron such as diborane is added to silane and oxygen, or trimethylborate added to Tetra ethylorthosilicate (TEOS). The $B_2O_3$ content typically varies from 2 to 20 weight percent. In the case of a phosphosilicate glass, the amount of $P_2O_5$ varies from 2 to 10 weight percent. In the case of phosphosilicate glass, phosphine or other precursors are added to the silane gas. Layer 110 is selected to have a thickness in the range of 100 Å–2500 Å. A layer of polysilicon 120 is deposited over layer 110, layer 120 preferably having a thickness in the range of 100 Å to 2500 Å. Polysilicon is deposited preferably using CVD or PECVD techniques, but can also be deposited using physical processes such as sputtering. CVD based processes use dichlorosilane or silane as the preferred silicon containing gas for polysilicon deposition. In the preferred process, the polysilicon layer 120 is deposited as an undoped layer. A layer of gate oxide 130, typically in the thickness range of 100 to 500 Å, but preferably 200 Å, is deposited over the polysilicon layer 120. In a preferred process, a layer of protective polysilicon 140, having a thickness of about 100–1000 Å is deposited over oxide Ålayer 130. The purpose of layer 140 is to shield the gate insulator from adverse plasma damage or ionic contamination from the resist process. Now, referring to FIG. 3B, layers 120, 130 and 140 are blanket deposited and are patterned together to define a gate electrode stack. The patterned gate stack now consists of a polysilicon electrode 120', a gate insulator 130' and a polysilicon cap 140'. Using known lithographic steps, a mask layer is formed to protect the gate electrode regions only. The remaining regions are etched away using preferably a RIE process preferably using the doped glass layer 110 as an etch stop. The gate stack may be etched in a multichamber reactor with different chambers used for etch process. Polysilicon is etched preferably using $CCl_2F_2$, and silicon dioxide is etched using $CF_4$ and $H_2$ gases. Where permissible wet etch processes can be used with very thin layers such as protective polysilicon layer 140. A mixture of pyrocatechol and ethylene diamine can be used to wet etch the protective polysilicon layer. It is however, preferred to used all reactive ion etch (RIE) processes in defining the gate stack.

Figure 3D:
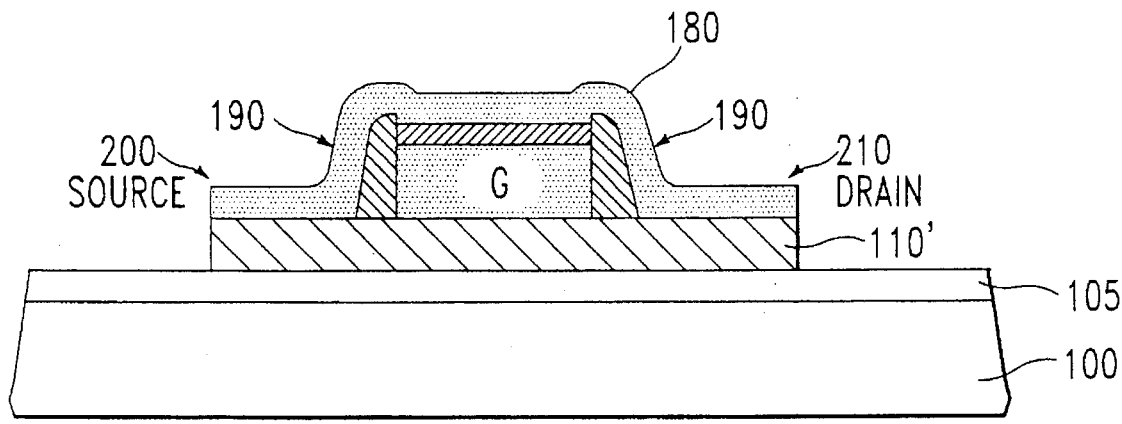

A blanket layer of insulating material 160, preferably silicon nitride, is deposited conformally over the entire substrate including the gate electrode stack 150. The layer 160 is etched in an anisotropic process removing all the material from the horizontal surfaces, thereby forming insulating spacers 170 along the sidewalls of the gate stack 150. The sidewall spacers 170 can be formed from any of the materials such as silicon nitride, silicon dioxide, silicon oxynitride, boron nitride or a combination of materials to form a sandwiched spacer. At this point the thin protective polysilicon 140 layer still remains as part of the gate stack 150, and may be removed by dip etching in a solution of ethylenediamine, pyrocatechol and water. In a preferred process, the polysilicon cap 140' is left behind to continue to protect the gate oxide and become part of the polysilicon channel. In cases where very thin body polysilicon ( device polysilicon layer) is desirable, it may be preferable to remove the protective polysilicon 140'. A blanket device layer of polysilicon (not shown- patterned part is layer 180) is deposited by use of CVD, PECVD or other physical deposition techniques. The blanket device polysilicon layer is patterned by lithography and dry etch to define the body polysilicon layer 180 as shown in FIG. 3D. At this point the etch can stop at the doped glass layer 110 or both can be patterned as a stack using known processes for etching polysilicon and oxide.

Referring to FIG. 3D again, the structure is heated to a temperature in the range of 700°–1100° C., preferably 900° C., for a fixed length of time to diffuse the dopants from the dopant source glass layer (for example, BSG or PSG) into the source 200, the drain 210 and the gate 120' polysilicon regions. Typically the gate electrode, source and drain regions are doped with impurities in the range of $10^{19}$ to $10^{21}$. The anneal time for diffusion drive-in can range from a minute in case of rapid thermal heating at the high end of the temperature range to several hours at the lower temperatures. Since very long diffusion times are undesirable in terms of furnace utilization, a maximum anneal time of 4 hours may be acceptable. The anneal temperature is accordingly determined to ensure adequate dopant mixing. In addition, by the choice of the diffusion conditions, the dopants can be diffused along the vertical parts 190 of the body polysilicon layer to realize different off-set lengths. The off-set length is roughly defined by the spacer dimension reduced by the dopant penetration along the vertical side of the body polysilicon. It is preferable to determine the optimum diffusion conditions by experimenting with different diffusion times and by electrically characterizing the device $I_{on}$, $V_{BD}$, $I_{off}$ and punch-thru. The patterned doped glass layer 110' is selected as BSG if one wants to dope it with boron and form PMOS devices or PSG if one wants to dope it with phosphorus and form NMOS devices. Other glasses can be used if one chooses to dope the device with antimony or arsenic. If the preference is to dope only the source and drain but not the gate electrode from the dopant source layer, this can be achieved by adding a diffusion barrier layer (not shown) such as silicon nitride underneath the gate stack 150, and including the barrier layer in the etching to form the gate stack. In that case, the gate polysilicon layer 120, as deposited, is doped with the desired impurity in the deposition process. Where required, the gate electrode 120' can be a polycide, a silicide or a metal electrode. This would only require selection of different etch gases in the gate stack definition.

Figure 4:
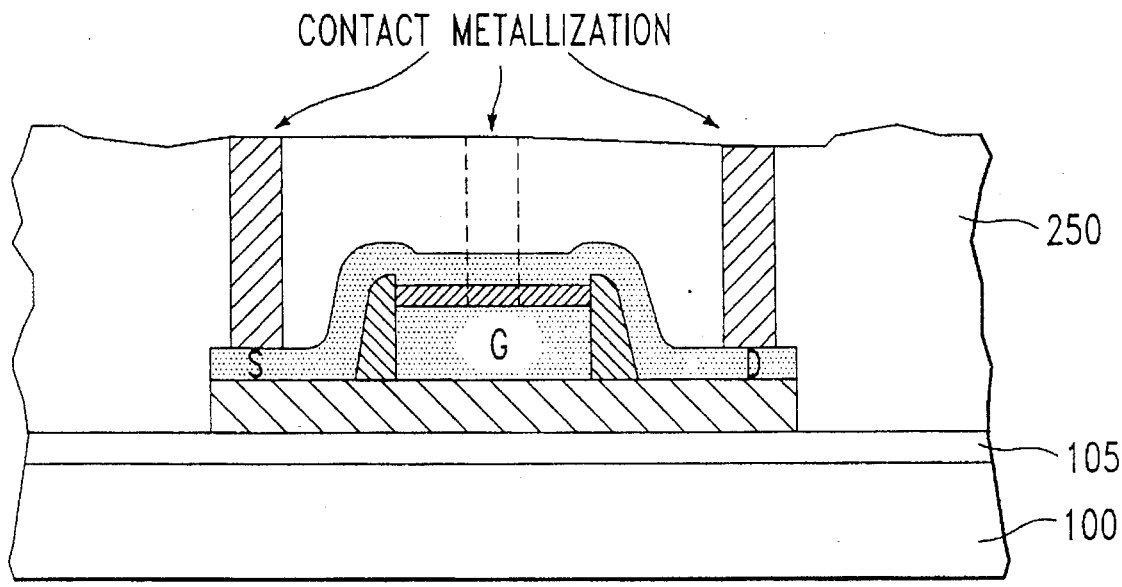
FIG. 4 is a cross section showing a contact wiring for the TFT device of FIG. 3.

Now referring to FIG. 4, an insulator 250 is deposited over the TFT device, and optionally planarized. Insulator 250 can be selected to be BPSG, PSG or undoped oxide or a combination of different insulators. Contact openings are etched into the insulator to expose the source/drain and gate regions, and contact studs or vias 260 formed using thin film metallization. Thus, any desired interconnection can be made between TFT devices at this level using the metallized contacts. Further, electrical connections can also be made to other FET devices below and above the TFT device level, to complete desired circuits.

While the invention has been described in terms of a single preferred embodiment, various alternatives and modifications can be devised by those skilled in the art without departing from the invention. Accordingly, the present invention is intended to embrace all such alternatives which fall within the scope of the appended claims.

What is claimed is:

1. A method of making a thin film transistor comprising the steps of:
   - providing a substrate with an insulating layer on top;
   - forming a dopant source layer containing dopants on the insulating layer;
   - forming a first layer of polysilicon on top of said dopant source layer;
   - forming a layer of gate insulator on said polysilicon;
   - patterning said polysilicon and said gate insulator to form a gate stack consisting of a gate electrode and gate insulator of said thin film transistor;
   - forming a sidewall spacer adjacent to and in contact with said gate stack on top of said dopant source layer;
   - forming a second layer of polysilicon so as to be on top and in contact with exposed surfaces of said gate stack, and said dopant source layer;
   - patterning said second layer of polysilicon to form a channel region, offset regions, source and drain regions of said thin film transistor; and
   - heating to diffuse said dopants from said dopant source layer into said source, drain regions and said gate electrode of said thin film transistor.

2. The method of claim 1, wherein a third layer of polysilicon is formed over said gate insulator prior to the patterning step to form said gate stack.

3. The method of claim 2, wherein said third layer of polysilicon is selected to have a thickness in the range of 100–5000 Å.

4. The method of claim 1, wherein said dopants are selected from the group consisting of boron, phosphorus, arsenic and antimony.

5. The method of claim 1, wherein said dopant source layer is borosilicate glass.

6. The method of claim 5, wherein said borosilicate glass contains 2–20 weight percent $B_2O_3$.

7. The method of claim 1, wherein said dopant source layer is phosphosilicate glass.

8. The method of claim 6, wherein said phosphosilicate glass contains 2–10 weight percent $P_2O_5$.

9. The method of claim 1, wherein said gate electrode has a thickness in the range of 100 to 2500 Å.

10. The method of claim 1, wherein said gate insulator layer is silicon dioxide.

11. The method of claim 1, wherein said gate insulator layer has a thickness in the range of 100–500 Å.

12. The method of claim 1, wherein said spacer has at least one layer, selected from the group consisting of silicon dioxide, silicon nitride, silicon oxynitride and boron nitride.

13. The method of claim 1, wherein said second polysilicon layer has a thickness in the range of 100–2500 Å.

14. The method of claim 1, wherein said heating to diffuse said dopants is carried out at a temperature selected from the range of 800° C.–1100° C., for a duration of 1 minute to 4 hours.

15. The method of claim 1, wherein said heating to diffuse said dopants is done by rapid thermal annealing.

16. The method of claim 1, further comprising the steps of:
   - depositing at least a layer of insulator over said substrate including said thin film transistor;
   - etching contact openings to said source, drain and gate regions of said thin film transistor; and
   - metallizing said contact openings so as to provide electrical connections to said source, drain and gate regions of said thin film transistor.

17. The method of claim 16, wherein said insulator is selected from the group consisting of silicon dioxide, BPSG and PSG.

\* \* \* \* \*